United States Patent [19]
Pugel

[11] Patent Number: 5,020,146
[45] Date of Patent: May 28, 1991

[54] LOSSY CONSTANT BANDWIDTH TUNED CIRCUIT

[75] Inventor: Michael A. Pugel, Indianapolis, Ind.

[73] Assignee: RCA Licensing Corporation, Princeton, N.J.

[21] Appl. No.: 338,703

[22] Filed: Apr. 17, 1989

[51] Int. Cl.$^5$ .......................... H04B 1/16; H04N 5/50
[52] U.S. Cl. ..................... 455/195; 455/191; 455/197; 455/261; 455/289; 455/340; 334/15; 333/174; 358/195.1
[58] Field of Search ............... 455/191, 195, 197, 261, 455/262, 289, 340, 341; 334/15; 333/174; 358/195.1; 11/11

[56] References Cited

U.S. PATENT DOCUMENTS

| | | | |
|---|---|---|---|
| 3,628,152 | 12/1971 | Carlson | 325/383 |
| 3,961,263 | 6/1976 | George | 325/421 |
| 4,312,064 | 1/1982 | Bench et al. | 370/71 |
| 4,646,360 | 2/1987 | Muterspaugh | 455/195 |
| 4,662,001 | 4/1987 | Cruz et al. | 455/197 |

Primary Examiner—Donnie L. Crosland
Attorney, Agent, or Firm—Joseph S. Tripoli; Peter M. Emanuel; Frederick A. Wein

[57] ABSTRACT

An amplifier loaded with a constant bandwidth tuned circuit is provided with an output series coil, and with a resistance in series with the output coil and a subsequent load to provide attenuation at high frequencies for maintaining the total overall gain of the amplifier and tuned circuit load constant with increasing frequency while simultaneously maintaining the bandwidth of the tuned circuit constant with increasing frequency.

8 Claims, 1 Drawing Sheet

LOSSY CONSTANT BANDWIDTH TUNED CIRCUIT

The present invention relates to radio frequency (RF) filters, and more particularly to tuned circuits used in television receivers.

Frequency selective tuned circuits are used before and after the RF amplifying stage of television receivers. In modern receivers these circuits employ voltage variable capacitance diodes (varactors) for electronic tuning. If simple parallel tuned circuits using varactors in shunt with a coil are used in conjunction with a constant load resistance, then, as the varactor capacitance changes in accordance with a tuning voltage applied thereto, the bandwidth becomes larger as the tuning frequency increases. This is undesirable as the possibility of interference from channels adjacent the desired channel increases.

One solution to the problem is shown in U.S. Pat. No. 3,628,152. In the arrangement shown therein, a pair of coils are placed in series with the source and load respectively, and a parallel varactor controlled tuned circuit is coupled between said coils and ground. The coils cause the equivalent resistance of the antenna and RF amplifier in parallel with the tuned circuit to increase as frequency increases. This causes the "Q" of the circuit to increase as frequency increases, thereby maintaining substantially constant bandwidth with increases in frequency of the tuned circuit. However, this arrangement suffers from inadequate attenuation as the frequency of interest increases.

In particular, the gain of an FET RF amplifier increases as the tuned circuit is tuned upwardly in frequency primarily for two reasons. Firstly, as the frequency increases, the inductively generated impedance of the coil increases proportionately while the associated resistance remains the same. Secondly, the capacitance of adjusted varactor diodes decreases from their original value when the resonant frequency of the circuit increases since the resonant frequency is inversely proportional to the square root of their equivalent capacitance. Thus, the capacitive reactance varies inversely with both frequency and capacitance, i.e. their reactance increases proportionally with frequency while the internal resistance of the varactor diode remains the same. Thus, the unloaded Q of the parallel resonant circuit increases with frequency and such increase of the equivalent resistance of the tuned circuit at resonance with increasing frequency helps to maintain constant bandwidth. However, the gain of the FET is the product of the transconductance of the device (about 18,000 micromohs for currently used devices) and the load resistance and as the equivalent resistance of the tuned circuit at resonance increases with frequency, the gain of the RF amplifier also increases with frequency (the transconductance of the FET remaining fairly constant). The net result is that since bandwidth is proportional to the resonant frequency and inversely proportional to the Q, the bandwidth of circuit does not substantially vary with its resonant frequency but the gain does increase. To reduce this increase in gain, typically, resistors are placed in shunt across the parallel tuned circuits of the tank circuit but this approach has difficulties since as the resistance of the shunt resistor decreases, the constant bandwidth properties of the tuned circuit are also decreased. In the prior art, this was the standard performance compromise which the present invention overcomes.

As used herein, television receiver(s) include apparatus for processing television signals without regard to whether they include a display device, e.g. television sets, VCR, etc.

SUMMARY OF THE INVENTION

Briefly, an amplifier loaded with a constant bandwidth tuned circuit is provided with an output series coil, and a resistance in series with the output coil to provide attenuation for maintaining the total overall gain of the amplifier and tuned circuit load constant with increasing frequency while simultaneously maintaining the bandwidth of the tuned circuit constant with increasing frequency.

DESCRIPTION OF THE DRAWINGS

For a better understanding of the present invention, reference may be had to the accompanying drawings wherein.

DETAILED DESCRIPTION OF THE PREFERRED EMBODIMENT

Figure 1:
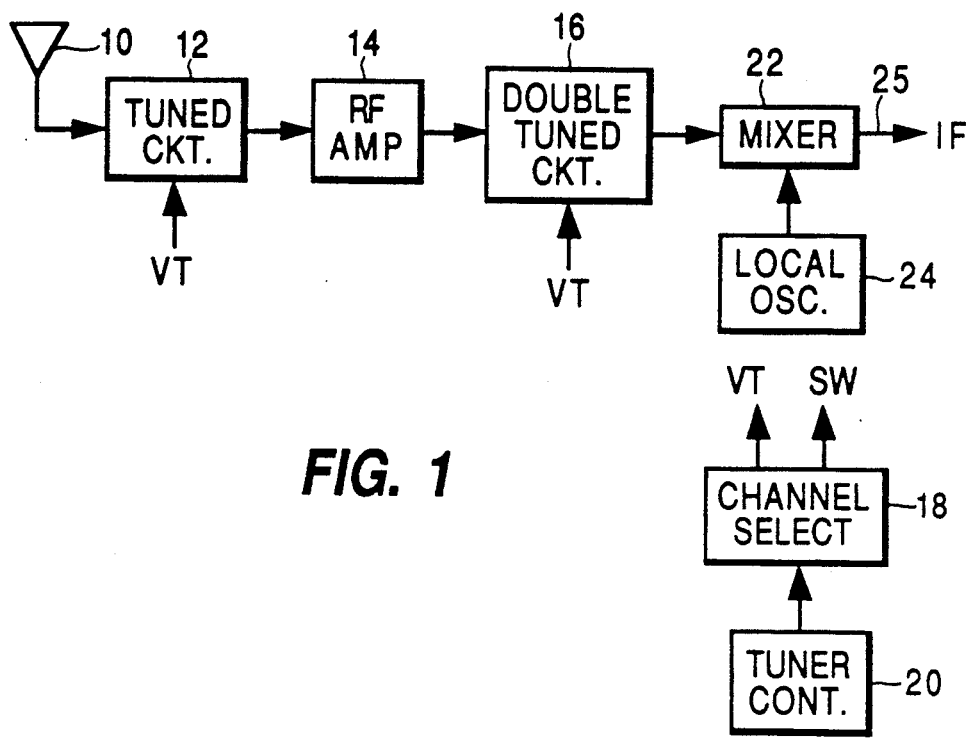
FIG. 1 is a block diagram of an exemplary tuner for a television receiver employing the present invention.

Referring now to the drawings wherein like reference numerals have been applied to like members, FIG. 1 shows an antenna 10 or other television signal source supplying radio frequency (RF) signals to a tuned circuit 12 feeding an RF amplifier 14 which in turn feeds a tuned circuit 16 which desirably is of a double tuned type in order to provide sufficient adjacent channel signal rejection. Circuits 12 and 16 receive a tuning voltage (VT) for tuning said circuits by application of the tuning voltage to internal varactor diode(s) (not shown). Tuning voltage (VT) is derived from a tuner control circuit 18 which in turn is controlled by a channel selection circuit 20. The tuning voltage (VT) determines which one of the RF signals corresponding to a television channel is selected by circuits 12 and 16 and applied to RF amplifier 14 and mixer 22 respectively.

The output signal from local oscillator 24 is applied to mixer 22. The oscillation frequency of local oscillator 24 is also controlled by VT and is designed to be in the range required for channels 2-13 and/or channels 14-69 in the UHF range and/or channels A-W in the CATV range. Mixer 22 provides an output 25 as an IF signal in the range of 41-47 MHz which is the conventional intermediate frequency (IF) range in the United States. The IF signal at the output 25 is then applied to conventional IF and baseband circuits (not shown) of the receiver for picture and sound processing.

Figure 2A:
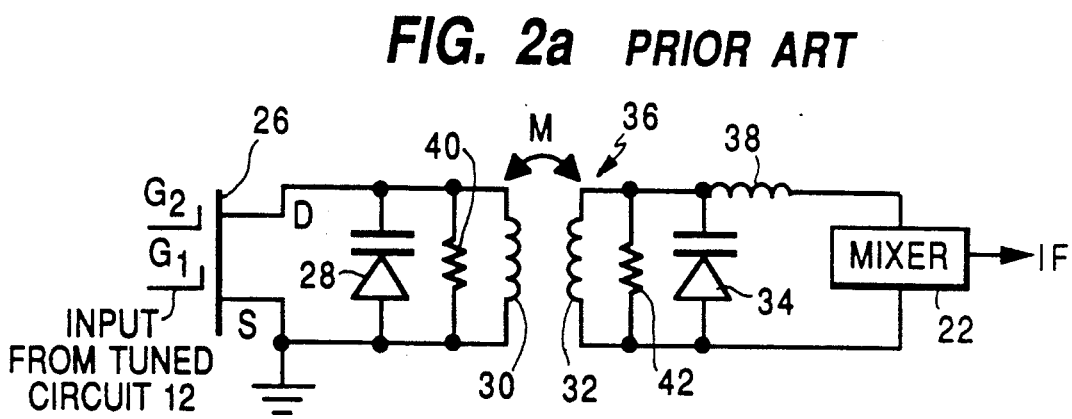
FIG. 2a is a schematic diagram of a double tuned television receiver RF amplifier used in the prior art.
Figure 2B:
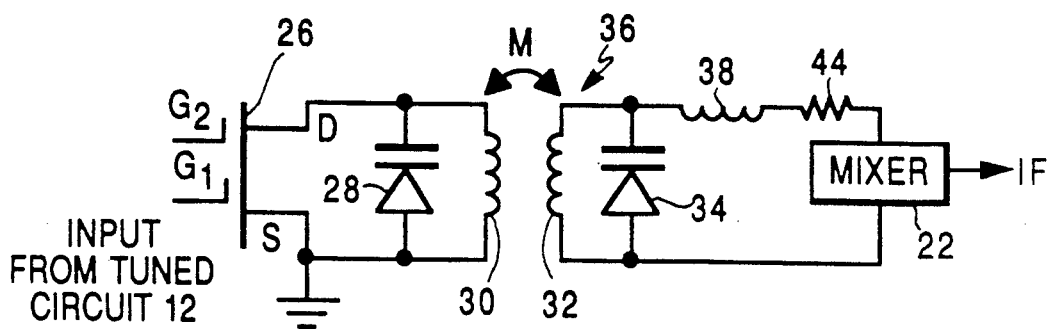
FIG. 2b is a schematic diagram of the amplifier of FIG. 2a modified according to the present invention.

FIGS. 2a and 2b show the details of tuned circuit 16 for a double tuned filter. However, the discussion hereinbelow for a double tuned filter is equally applicable to single tuned circuits commonly used in circuit 12. The schematic of FIG. 2a shows a prior art circuit commonly used. FIG. 2b shows a schematic of the prior art tuned circuit of FIG. 2a modified according to the present invention. Referring now to FIGS. 2a and 2b, the signals from FET amplifier 26 are applied across varactor 28 in shunt with primary tank coil 30. Secondary tank coil 32 is tuned by varactor diode 34 such that the tank circuit 36 is a double tuned tank with an appropriate amount of mutual coupling between coils 30 and 32. The tuning of double tuned tank circuit 36 is accomplished by application of tuning voltage VT (not shown) to varactor diodes 28 and 34 in a manner well known in the art. Coil 38 in series with the output of secondary tank coil 32 increases in impedance with increasing frequency and thus helps to maintain constant bandwidth operation of the circuit as will be more fully discussed hereinafter.

In operation, as the selected channel increases in frequency, the voltage VT increases thus causing the tank circuit 36 to resonate at progressively higher frequencies (the capacitance of the varactor diodes 28 and 34 decreases). The tuned tank circuit 36 has the characteristic as discussed hereinabove that the load impedance on RF amplifier 26 gets increasingly higher with increasing frequency such that equivalent load resistance of the parallel tuned circuit 36 increases because the "Q" of circuit 36 increases with increasing frequency while maintaining constant bandwidth. Coil 38 also attenuates high frequency signals since its series reactance increases with increasing frequency.

In the prior art, as shown in FIG. 2a and discussed hereinabove, resistors 40 and 42 are coupled across primary coil 30 and secondary coil 32 respectively in order to flatten out or reduce the gain increase of FET amplifier 26 with increasing frequency. As discussed hereinabove, this results in increasing the bandwidth with frequency which is a troublesome compromise.

The Carlson patent discussed hereinabove teaches how to achieve constant bandwidth of the double tuned circuit 36 when used with the series inductance 38. Accordingly, Carlson, U.S. Pat. No. 3,628,152 of a common assignee, is expressly incorporated by reference herein. However, Carlson does not overcome the gain problem discussed hereinabove, and to this end, resistor 44 is added in series with the load transforming inductor 38 thus retaining the constant bandwidth operation of the circuit 36 with series inductor 28 while being able to arbitrarily adjust the gain of the total circuit by the addition of resistor 44 without degrading the constant bandwidth characteristics of the circuit as in the prior art shown in FIG. 2 by the addition of resistors 40 and 42.

The determination of the values of inductor 38 and resistor 44 is as follows: First, determine the load resistance across the tuned circuit by the desired bandwidth and reactance for the tuning varactor diode. Second, determine the excess gain that would be produced by the Carlson matching technique using a lossless match to the load. Thirdly, choose a series resistor (Rs in the equations) which will negate this excess gain when placed in series with the load, and Fourthly, compute the value of series inductance (Ls in the equations) needed to transform the load resistance plus Rs to the desired load across the tuned circuit in step 1 above.

Parallel tuned circuit, e.g. tank 36, having a series coil 38 can be looked at circuit wise as an equivalent coil to ground. Such can be considered as conversion of a series (Thevenin) equivalent to a parallel (Norton) equivalent. At resonance, the parallel tuned circuit can be considered as a parallel equivalent resistance given by the ratio of $(Q^2+1)Rs = Rp$ (equation 1) where Rs is the load resistor in the Carlson patent and is the equivalent load resistance presented by the mixer circuit 22 plus the separate series resistor 44. Since $Q = Xs/Rs$ (equation 2) or $Q = Rp/Xp$ (equation 3), the resultant Q is approximately a linear function of frequency as desired for constant bandwidth.

For example, assume as a first approximation that at the bottom of a band, the series reactance of coil 38 as determined according to the teaching of the Carlson patent is about 200 ohms and that the increase in gain between the low and high frequencies requires a series resistance of 50 ohms to equalize gains into a 50 ohm load (the mixer input impedance), using the well known equations stated above, this would yield a parallel resistance of 850 ohms with a Q of 4 at 50 MHz. At 100 MHz, the reactance becomes 400 ohms and the Q becomes 8 yielding a parallel resistance value of 45 times 50 which equals 3200 ohms. Remembering that as we increase in frequency, the bandwidth is constant while Q increases with frequency. If we now using the equations to convert back to a series circuit, we use the equation No. 2 above to get the value of coil 38 and then calculating the resistance of the Thevenin equivalent circuit we get a value of R44 (Rs) to add to the circuit in series with coil 38. We can now more closely approximate the correct value of series inductor 38 as taught by Carlson and adjust if necessary. Thus one can get the same reflected load but with the introduction of gain loss to absorb power, thus keeping the overall gain fairly constant (the gain of the amplifier and the tuned circuit loading the amplifier), i.e., the signal amplitude presented to the following stage such as a mixer has a similar gain slope with frequency increase except at lower gain levels without the compromise introduced by coupling the parallel resistances 40 and 42 across the tank circuit as discussed hereinabove.

Thus, using the conversion equations between Thevenin and Norton equivalents and their respective Q's, the inductance value of coil 38 can be adjusted for proper bandwidth of the overall circuit, and the value of resistor 44 can thus be determined when considered in series with the secondary circuit's equivalent Thevenin output resistance and the input resistance of the next stage resistance.

Although the invention has been described in conjunction with a single conversion tuner, it may be also used with a double conversion tuner. Additionally, even though the exemplary embodiment is a double tuned circuit, the equations used and the invention disclosed is also applicable to single tuned circuits. Further, the gain change with increased frequency as discussed herein and overcome by the present invention includes compensating for gain changes between switched bands of the television RF tuner. In such a case, resistor 44 can comprise a plurality of resistors in series or parallel with each other as appropriate and such resistors can be switched into and out of the circuit when different bands of frequencies are tuned.

While there has been illustrated and described what is at present considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed is:

1. In a television tuner, a constant bandwidth, double tuned circuit comprising:
   a primary tank circuit comprising a first capacitor coupled in parallel with a first inductance for resonating at a first predetermined frequency, a secondary tank circuit comprising a second capacitor means coupled in parallel with a second inductance for resonating at a second predetermined frequency, said first inductance and said second inductance having a mutual coupling means therebetween, a third inductance coupled in series with the second inductance, and a resistance coupled in series with the third inductance and a subsequent circuit load having an input impedance, said resistance and said input impedance comprising a load for the primary and secondary tank circuits, the value of the third inductance being selected for providing a constant bandwidth with increasing frequency signal transfer between the tank circuit and the subsequent circuit load, the value of the resistance being selected for adjusting the amplitude of the signal fed to the subsequent load with increasing frequency.

2. The circuit of claim 1 wherein the third inductance is a constant bandwidth inductance.

3. The circuit of claim 2 wherein the signal into the primary of the tank circuit is fed from a signal source and wherein the gain of the signal source loaded by the primary of the tank circuit increases with increasing frequency, the value of the resistance being selected for compensating for the increase of gain of the signal source with increasing frequency.

4. The circuit of claim 3 wherein the signal source is a FET. each of the first capacitor means and the second capacitor means are varactor diodes, the first and second predetermined frequencies being substantially the same.

5. In a television tuner, a constant bandwidth, double tuned circuit comprising:
a primary tank circuit comprising a first capacitor means coupled in parallel with a first inductance for resonating at a first predetermined frequency, a signal amplification source loaded by the primary of the tank circuit wherein the gain of the signal amplification source is changeable with load, a secondary tank circuit comprising a second capacitor means coupled in parallel with a second inductance for resonating at a second predetermined frequency, said first inductance and said second inductance having a mutual coupling means therebetween, the signal into the primary of the tank circuit being fed from the signal amplification source, a third inductance coupled in series with the second inductance, the third inductance being a constant bandwidth inductance, and a resistance coupled in series with the third inductance and a subsequent load, said resistance and subsequent load comprising a total load for the primary and secondary tank circuits, the value of the third inductance being selected for providing a constant bandwidth signal transfer with increasing frequency between the signal amplification source and the subsequent load, the value of the resistance being selected for adjusting the amplitude of the signal fed to the subsequent load with increasing frequency.

6. The circuit of claim 3 wherein the signal source is a FET, each of the first capacitor means and the second capacitor means are varactor diodes, the first and second predetermined frequencies being substantially the same.

7. In a television tuner, a constant bandwidth tuned circuit comprising:
a tank circuit comprising a capacitor means coupled in parallel with a first inductance for resonating at a predetermined frequency, a signal amplification source loaded by the primary of the tank circuit wherein the gain of the signal amplification source changes with load, a second inductance coupled in series with the first inductance, the second inductance being a constant bandwidth inductance, a resistance coupled in series with the second inductance, said resistance and a subsequent load comprising a total load for the tank circuit, the value of the second inductance being selected for providing constant bandwidth signal transfer with increasing frequency between the signal amplification source and the subsequent load, the value of the resistance being selected for adjusting the amplitude of the signal fed to the subsequent load with increasing frequency.

8. In a television tuner, a constant bandwidth tuned circuit comprising:
a tank circuit comprising a capacitor means coupled in parallel with a first inductance for resonating at a predetermined frequency, a second inductance coupled in series with the first inductance, the second inductance being a constant bandwidth inductance, and a resistance coupled in series with the second inductance, said resistance and a subsequent load comprising a total load for the tank circuit, the value of the second inductance being selected for providing constant bandwidth signal transfer with increasing frequency between tank circuit and the subsequent load, the value of the resistance being selected for adjusting the amplitude of the signal fed to the subsequent load with increasing frequency.

* * * * *